(12) United States Patent
Liu (10) Patent No.: US 8,570,784 B2
(45) Date of Patent: Oct. 29, 2013

(54) DIFFERENTIAL ROM

(75) Inventor: Jack Liu, Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 90 days.

(21) Appl. No.: 13/192,702

(22) Filed: Jul. 28, 2011

(65) Prior Publication Data

US 2013/0028002 A1    Jan. 31, 2013

(51) Int. Cl.
*G11C 17/08* (2006.01)

(52) U.S. Cl.
USPC ............................................. 365/104; 365/96

(58) Field of Classification Search
None
See application file for complete search history.

(56) References Cited

U.S. PATENT DOCUMENTS

| | | | |
|---|---|---|---|
| 4,096,522 A * | 6/1978 | Suzuki et al. | 257/390 |
| 4,546,453 A | 10/1985 | Noufer | |
| 4,903,237 A | 2/1990 | Rao | |
| 5,420,818 A | 5/1995 | Svejda et al. | |
| 5,862,091 A * | 1/1999 | Bion et al. | 365/207 |
| 6,147,893 A | 11/2000 | Liu | |
| 6,172,923 B1 | 1/2001 | Liu | |
| 6,185,147 B1 | 2/2001 | Liu | |
| 6,813,205 B2 | 11/2004 | Huang | |
| 6,850,427 B1 | 2/2005 | Prestwich | |
| 2004/0196715 A1 | 10/2004 | Huang | |
| 2008/0008019 A1* | 1/2008 | Balasuramanian | 365/208 |
| 2009/0141580 A1* | 6/2009 | Evans et al. | 365/230.06 |

* cited by examiner

*Primary Examiner* — Hoai V Ho
*Assistant Examiner* — James G Norman
(74) *Attorney, Agent, or Firm* — Duane Morris LLP (57) ABSTRACT

A differential read only memory array includes a differential sense amplifier coupled to first and second bit lines. A first bit cell is coupled to a first word line and to the first and second bit lines. The at least one bit cell includes a first transistor having a gate coupled to the first word line, a drain coupled to the first bit line, and a source coupled to a first power supply line. A second transistor has a gate coupled to the first word line. A source and a drain of the second transistor are either both connected to the second bit line or both unconnected to the second bit line.

18 Claims, 7 Drawing Sheets

DIFFERENTIAL ROM

FIELD OF DISCLOSURE

The disclosed system and method relate to integrated circuit memories. More specifically, the disclosed system and method relate to differential read only memories.

BACKGROUND

Read only memories ("ROMs") include a plurality of cells disposed in rows and columns to form an array. Conventional ROM cells are single-ended and include a plurality of transistors coupled to bit lines and word lines that are used to read and write a bit of data to the memory cell. However, these conventional single-ended ROMs have high area and power penalties and slower speeds due to large loads on bit lines. Additionally, the VCCmin performance of the ROMs are limited by the design and implementation of keeper circuits, which are implemented for assistance during read operations.

DETAILED DESCRIPTION

Figure 1:
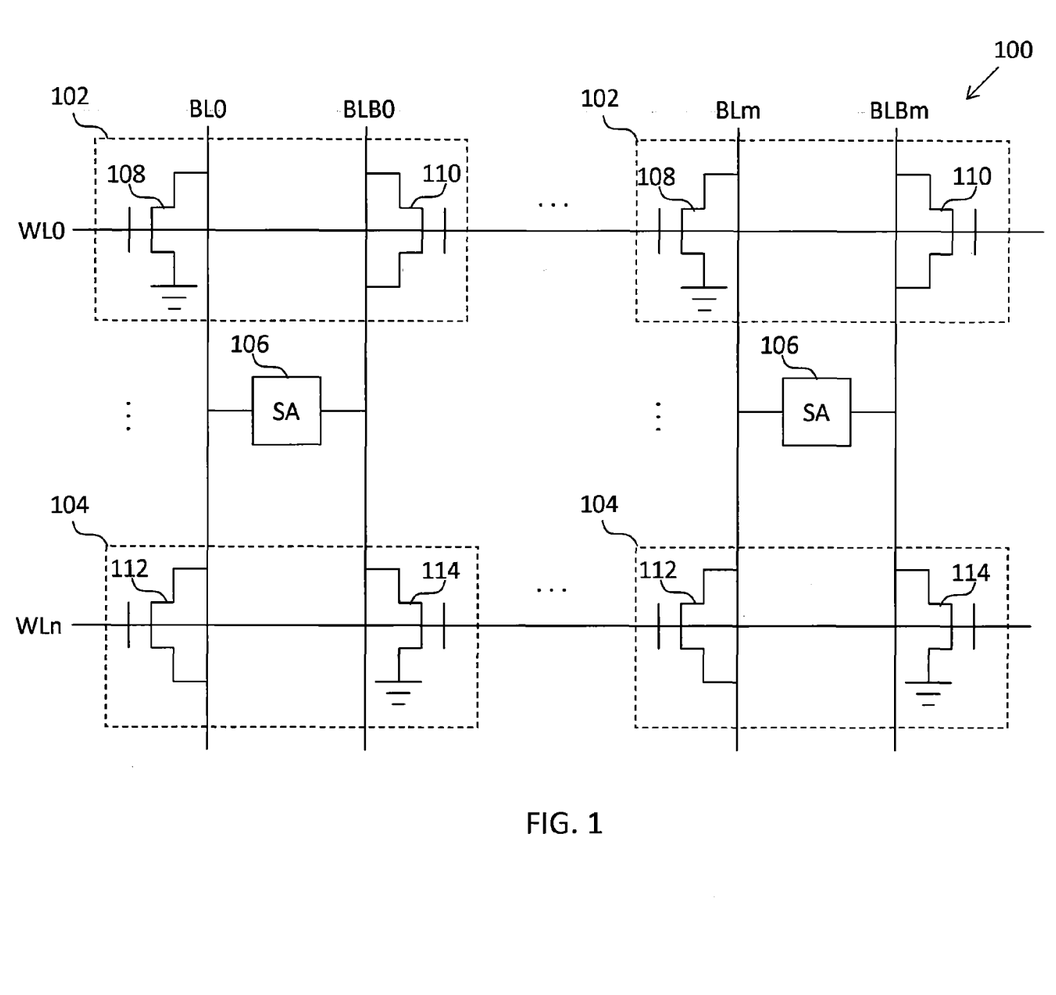
FIG. 1 illustrates one example of a differential ROM array including a plurality of programmed zero and programmed one bit cells.

FIG. 1 illustrates one example of an improved read only memory ("ROM") array 100A. As shown in FIG. 1, ROM array 100 may include a plurality of differential program zero cells 102 and a plurality of differential program one cells 104 arranged in a number, n, of rows and a number, m, of columns. Each bit cell 102, 104 in a row is coupled to a word line ("WL"), and each bit cell 102, 104 in a column is coupled to differential pair of bit lines, BL and BLB. At least one differential sense amplifier ("SA") 106 is coupled between each differential bit line pair, BL and BLB, for increasing the speed of reading of a bit of data stored in a bit cell 102, 104.

Programmed zero bit cells 102, i.e., bit cells that output a logic zero when read, include a first transistor 108 having its source coupled to ground, its drain coupled to one of the differential bit lines, i.e., BL, and its gate coupled to WL. A second transistor 110 has its gate coupled to WL and its drain and source coupled to the other complementary bit line, i.e., BLB.

Programmed one bit cells 104, i.e., bit cells that output a logic one when read, also include a pair of transistors 112, 114. Transistor 112 has its gate coupled to the WL and its source and drain coupled to one of the complementary bit lines, i.e., BL. Transistor 114 has its gate coupled to the WL, its source coupled to ground or a low voltage supply line, and a drain coupled to the other complementary bit line, BLB. Directly coupling the sources and drains of the transistors 110 to the BL of programmed one transistors 110 and the sources and drains of transistors 108 to the BLB advantageously reduces noise sensitivity compared to conventional single-ended bit lines. Although transistors 108, 110, 112, and 114 are illustrated as NMOS transistors, one skilled in the art will understand that bit cells 102 and 104 may be implemented using PMOS transistors by inverting the WL.

Figure 2:
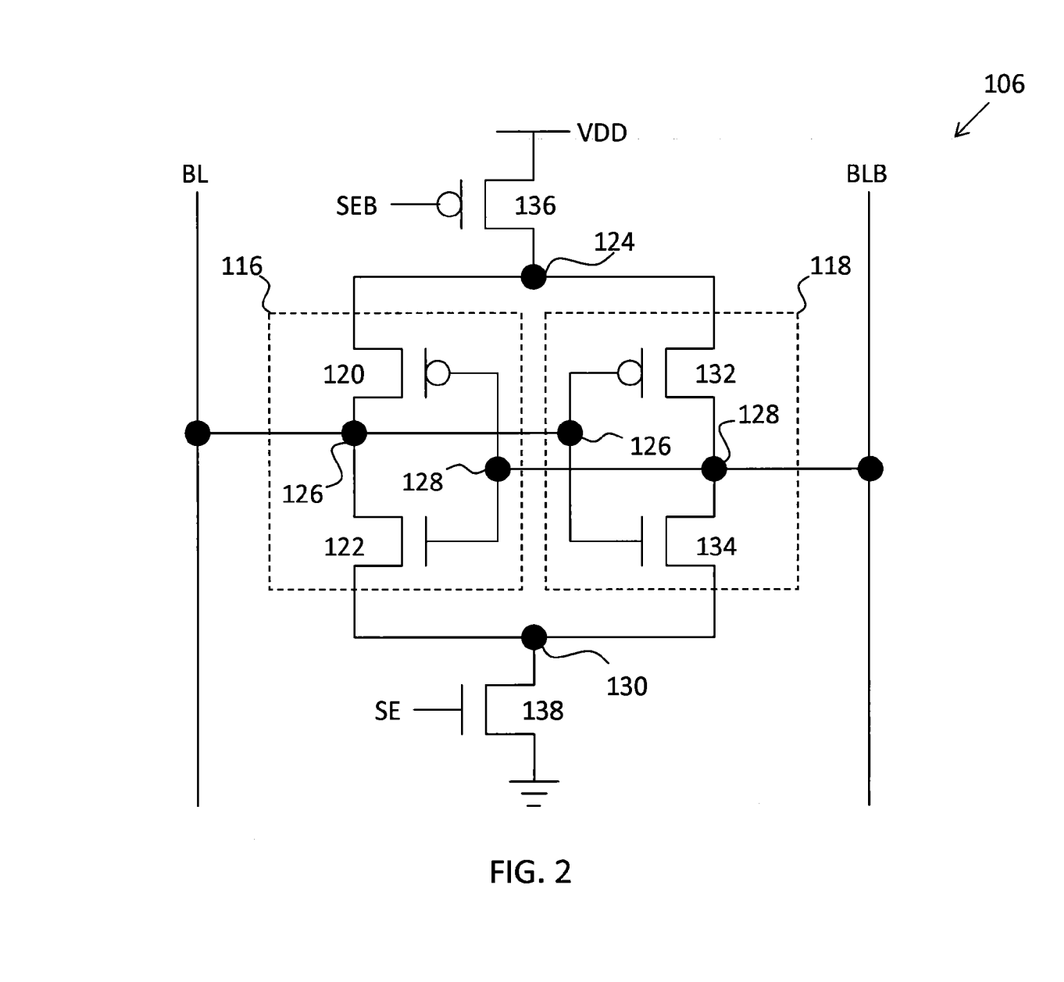
FIG. 2 illustrates one example of a sense amplifier in accordance with the differential ROM array illustrated in FIG. 1.

FIG. 2 illustrates one example of a sense amplifier 106. As shown in FIG. 106, SA 106 includes a pair of cross-coupled inverters 116, 118 coupled between complementary bit lines BL and BLB. Inverter 116 includes a PMOS transistor 120 and an NMOS transistor 122 coupled together in series. PMOS transistor 120 has its source coupled to node 124, its drain coupled to node 126, and its gate coupled to node 128. Transistor 122 has its source coupled to node 130, its drain coupled to node 126, and its gate coupled to node 128. Node 128 serves as the input of inverter 116 and is coupled to complementary bit line BLB. Node 126 serves as the output of inverter 116 and is coupled to complementary bit line BL.

Inverter 118 includes a PMOS transistor 132 and an NMOS transistor 134. PMOS transistor 132 has its source coupled to node 124, its drain coupled to node 128, and its gate coupled to node 126. NMOS transistor 134 has its source coupled to node 130, its drain coupled to node 128, and its gate coupled to node 126. Node 128 serves as the output of inverter 118 and is coupled to complementary bit line BLB, and node 126 serves as the input of inverter 118 and is coupled to complementary bit line BL.

Node 124 may be coupled directly to a high voltage power supply or to a drain of a PMOS transistor 136 as shown in FIG. 2. PMOS transistor 136 has its source coupled to the high voltage power supply and its gate is configured to receive a sense enable control signal, SEB. High voltage power supply may have a voltage set at VDD, or it may be set at a boosted voltage having a voltage level higher than a voltage level of VDD.

Node 130 may be directly coupled to a low voltage power supply, or node 130 may be coupled to a drain of NMOS transistor 138 as illustrated in FIG. 2. Transistor 138 has its source coupled to the low voltage power supply and its gate is configured to receive sense enable control signal, SE. As will be understood by one skilled in the art, sense enable control signals SE and SEB may be the inverse of one another. Low voltage power supply may be set at ground, VSS, or at a voltage having a negative or lower voltage level than the voltage level of ground or VSS.

Figure 3A:
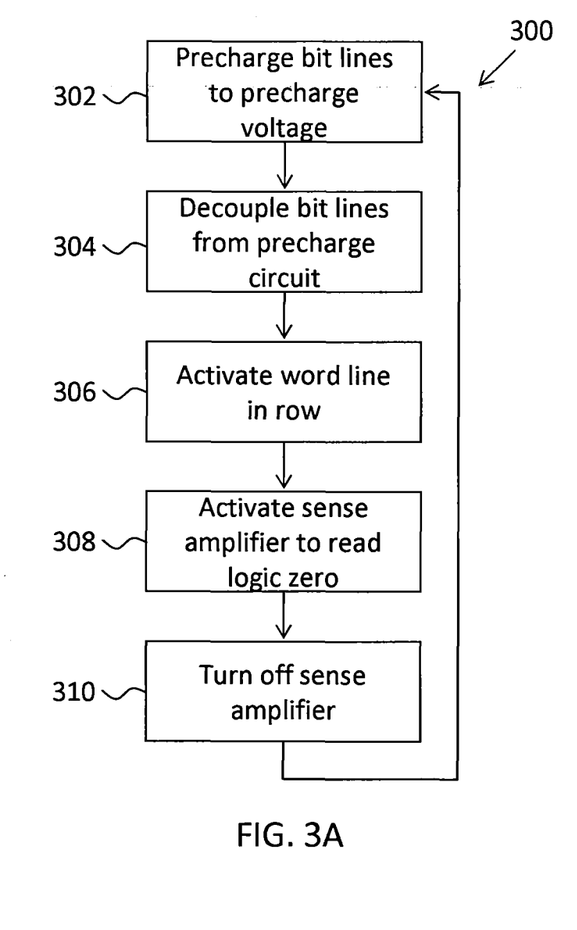
FIG. 3A is a flow diagram of one example of a method of reading a logic zero from a programmed zero bit cell in accordance with the differential ROM array illustrated in FIG. 1.

The reading of a logic zero from a programmed zero bit cell 102 is described with reference to FIG. 3A, which is a flow diagram of one example of a method 300 for reading a logic zero from a differential ROM bit cell in accordance with the ROM array 100 illustrated in FIG. 1. At block 302, complementary bit lines BL and BLB are charged to a precharge voltage, $V_{PC}$, by a precharge circuit (not shown). In some embodiments, the voltage level of $V_{PC}$ may be approximately equal to the supply voltage, VDD, of the differential ROM array 100. However, one skilled in the art will understand that $V_{PC}$ may have other voltage levels relative to supply voltages VDD and VSS, e.g., approximately ½VDD, equal to VSS, etc.

At block 304, complementary bit lines BL and BLB are decoupled from the precharge voltage, $V_{PC}$, such that BL and BLB may be momentarily floating. A WL is activated at block 306 to select a row of bit cells 102, 104, and a sense amplifier 106 in the column in which the cell from which data is to be read is activated at block 308. One skilled in the art will understand that blocks 304, 306, and 308 may be performed in a non-sequential order (i.e., block 308 may be performed prior to block 306) or may be performed simultaneously with one another.

When the WL is asserted high (for bit cells comprising NMOS transistors), transistor 108 is in a current-conducting 'on' state due to its gate-source voltage, $V_{GS}$, being greater than its threshold voltage, $V_{T108}$. BL is pulled towards ground or to a low voltage level when transistor 108 is on as current flows through transistor 108. The voltage of BLB is maintained at a logic one since the charge on BLB does not have a path to ground due to the source and drain of transistor 110 being coupled together and to BLB. Additionally, the WL being charged to a logic one also maintains BLB at a logic one by continuing to charge the capacitor formed by transistor 110 to a logic one.

Sense amplifier 106 assists in increasing the voltage on BLB while decreasing the voltage on BL. For example, sense amplifier may be activated by receiving a logic one at the gate of transistor 138, i.e., SE is a high voltage, and receiving a logic zero at the gate of transistor 136, i.e., SEB is a low voltage. A high voltage at the gate of transistor 138 turns transistor 138 on, which results in node 130 being pulled down, and a low voltage at the gate of transistor 136 turns transistor 136 off, which results in node 124 being pulled up.

As the BL is pulled low by transistor 108, the low voltage is received at the input of transistor 118, i.e., node 126, which results in transistor 134 turning off and transistor 132 turning on due to their respective sources being coupled to the low voltage supply and the high voltage supply. The voltage of the high voltage supply develops at node 128, which is coupled to complementary bit line BLB, when transistor 132 is on and transistor 134 is off to assist in complementary bit line BLB being pulled high. Node 128 being pulled high turns on transistor 122 and turns off transistor 120 due to their gates being coupled to a high voltage and their respective sources being coupled to the low voltage supply and the high voltage supply. Transistor 122 turning on couples low voltage supply to node 126, which is coupled to BL, to assist complementary bit line BL in being pulled low.

At block 310, the sense amplifier 106 is turned off or is decoupled from complementary bit lines BL and BLB. Sense amplifier 106 is turned off or decoupled from complementary bit lines BL and BLB by transitioning sense enable control signal SE to a logic low and sense enable control signal SEB to a logic high. The low voltage received at the gate of transistor 138 turns transistor 138 off such that node 130 is effectively floating, and the high voltage received at the gate of transistor 136 turns transistor 136 off such that node 124 is effectively floating.

Complementary bit lines may be coupled to the precharge voltage, $V_{PC}$, as method 300 returns to block 302.

Figure 3B:
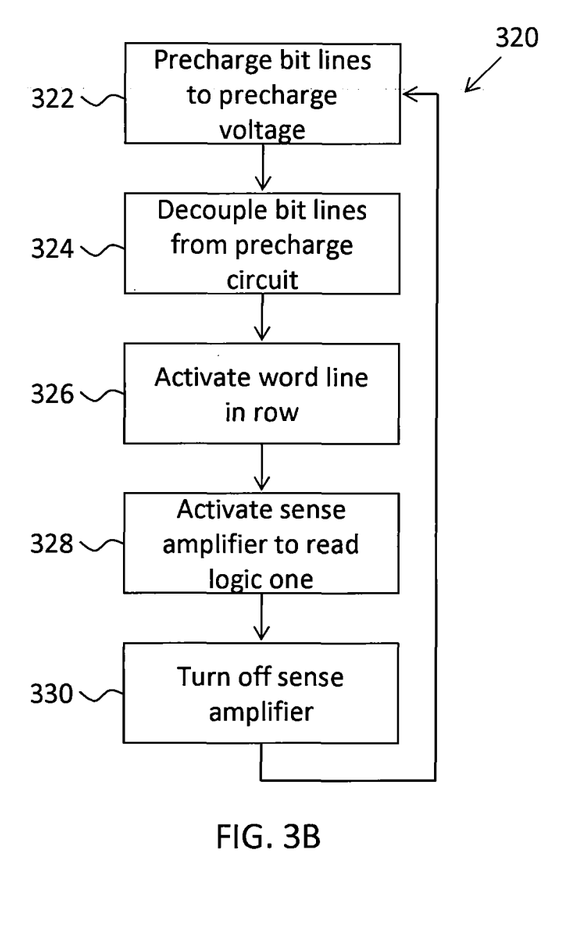
FIG. 3B is a flow diagram of one example of a method of reading a logic one from a programmed one bit cell in accordance with the differential ROM array illustrated in FIG. 1.

The reading of a logic one from a programmed one bit cell 104 is described with reference to FIG. 3B, which is a flow diagram of one example of a method 320 reading a logic one from a differential ROM bit cell in accordance with the differential ROM array 100 illustrated in FIG. 1. At block 322, complementary bit lines BL and BLB are precharged to a precharge voltage, $V_{PC}$. As described above, the voltage level of $V_{PC}$ may be approximately equal to VDD.

At block 324, complementary bit lines BL and BLB are decoupled from the precharge voltage such that BL and BLB may be momentarily floating. A WL is activated at block 326 to select a row of bit cells 102, 104, and sense amplifier 106 in the column in which the cell from which data is to be read is activated at block 328. One skilled in the art will understand that blocks 324, 326, and 328 may be performed in a non-sequential order (i.e., block 328 may be performed prior to block 326) or may be performed simultaneously with one another.

When WL is asserted high, transistor 114 is in a current-conducting 'on' state due to its gate-source voltage, $V_{GS}$, being greater than its threshold voltage, $V_{T114}$. BL is pulled towards ground or to a low voltage level when transistor 114 is on as current flows through transistor 114. The voltage of BL is maintained at a logic one since the charge on BL does not have a path to ground due to the source and drain of transistor 110 being coupled together and to BL. Additionally, the WL being charged to a logic one also maintains BL at a logic one by continuing to charge the capacitor formed by transistor 110 to a logic one.

Sense amplifier 106 assists in increasing the voltage on BL while decreasing the voltage on BLB. For example, sense amplifier 106 may be activated by receiving a logic one at the gate of transistor 138, i.e., SE is a high voltage, and receive a logic zero at the gate of transistor 136, i.e., SEB is a low voltage. A high voltage at the gate of transistor 138 turns transistor 138 on, which results in node 130 being pulled down, and a low voltage at the gate of transistor 136 turns transistor 136 off, which results in node 124 being pulled up.

As the BLB is pulled low by transistor 114, the low voltage is received at the input of transistor 120, i.e., node 128, which results in transistor 122 turning off and transistor 120 turning on due to their respective sources being coupled to the low voltage supply and the high voltage supply. The voltage of the high voltage supply develops at node 126, which is coupled to complementary bit line BL, when transistor 120 is on and transistor 122 is off to assist in complementary bit line BL being pulled high. Node 126 being pulled high turns on transistor 134 and turns off transistor 132 due to their gates being coupled to a high voltage and their respective sources being coupled to the low voltage supply and the high voltage supply. Transistor 134 turning on couples low voltage supply to node 128, which is coupled to BLB, to assist complementary bit line BLB in being pulled low.

At block 330, the sense amplifier 106 is turned off or is decoupled from complementary bit lines BL and BLB. Sense amplifier 106 is turned off or decoupled from complementary bit lines BL and BLB by transitioning sense enable control signal SE to a logic low and sense enable control signal SEB to a logic high. The low voltage received at the gate of transistor 138 turns transistor 138 off such that node 130 is effectively floating, and the high voltage received at the gate of transistor 136 turns transistor 136 off such that node 124 is effectively floating.

Complementary bit lines BL and BLB may be coupled to the precharge voltage, $V_{PC}$, as method 320 returns to block 322.

Figure 4:
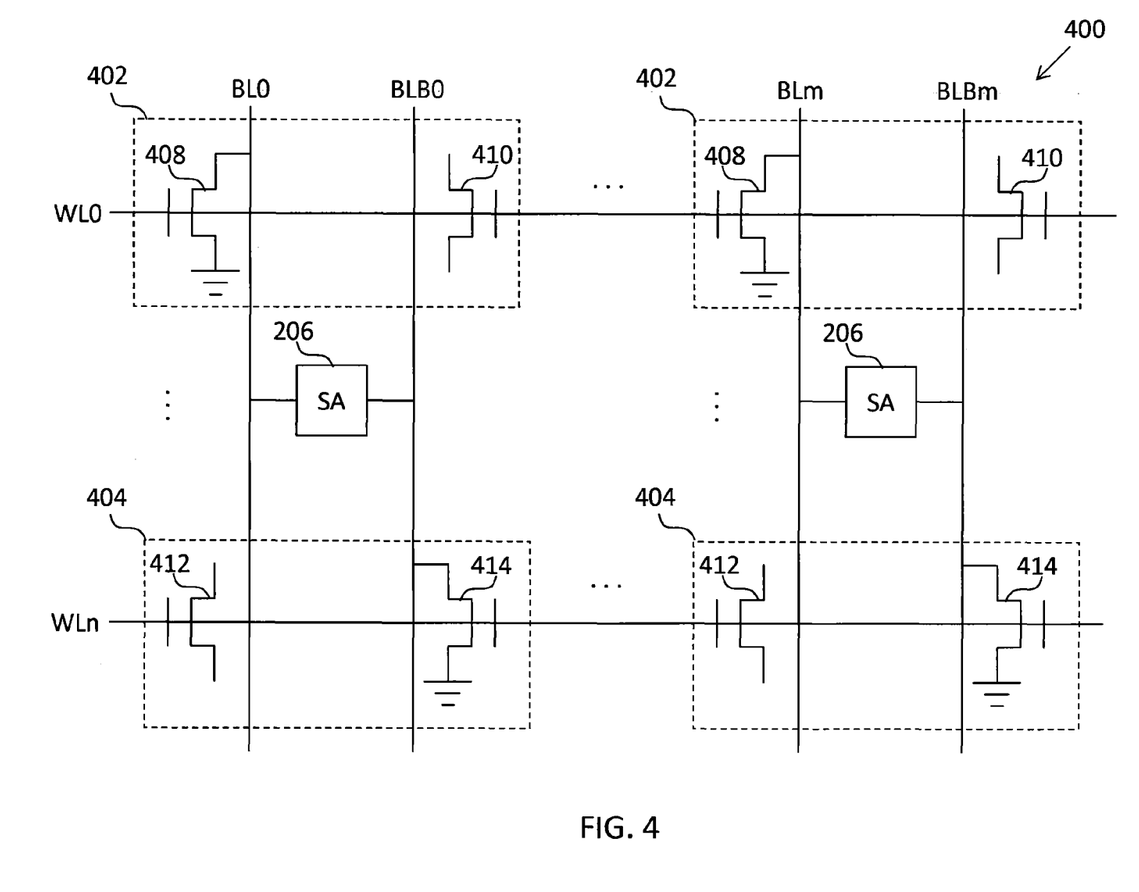
FIG. 4 illustrates another example of a differential ROM array including a plurality of programmed zero and programmed one bit cells.

FIG. 4 illustrates another embodiment of a differential ROM array 400. As shown in FIG. 4, ROM array 400 includes a plurality of programmed zero cells 402 and programmed one cells 404 arranged in a number, n, of rows and a number, m, of columns. Each row of bit cells 402, 404 is coupled to a WL and each column of bit cells is coupled to a pair of complementary bit cells, BL and BLB. A differential SA 406 is coupled between each pair of complementary bit lines BL and BLB for assisting in reading data from the bit cells 402, 404.

Programmed zero bit cells 402 each include a pair of transistors 408 and 410 each having a gate coupled to a common WL. Transistor 408 has its source coupled to ground and its drain coupled to BL. The drain and source of transistor 410 are floating, i.e., the drain and source of transistor 410 are not connected to BLB.

Programmed one bit cells 404 each include a first transistor 412 having a gate coupled to complementary bit line BL and a second transistor 414 having a gate coupled to complementary bit line BLB. Transistor 412 has its source coupled to ground or to a low voltage supply line and its drain coupled to BLB.

Implementing transistors 410 of programmed zero bit cells 402 and transistors 414 of programmed one bit cells such that each has its respective source and drain unconnected to BL or BLB advantageously reduces bit line loading and reduces charge sharing effects.

Figure 5:
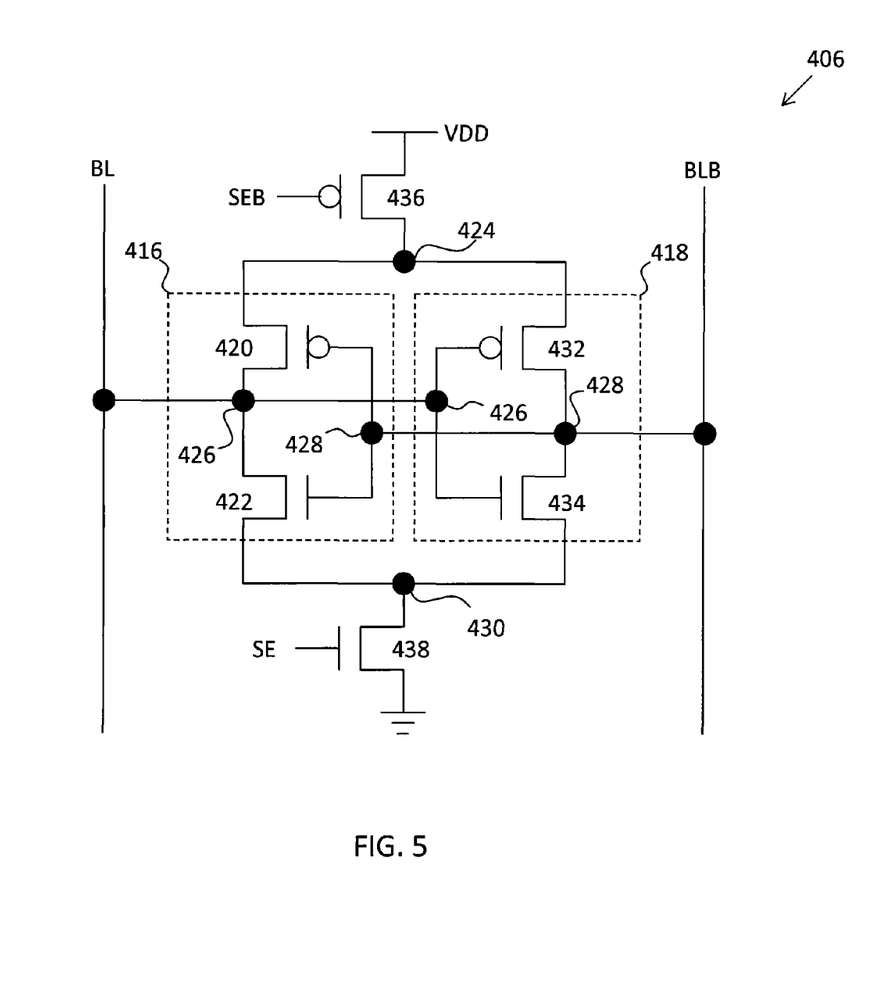
FIG. 5 illustrates one example of a sense amplifier in accordance with the differential ROM array illustrated in FIG. 4.

FIG. 5 illustrates one example of a sense amplifier 406. As shown in FIG. 406, SA 406 includes a pair of cross-coupled inverters 416, 418 coupled between complementary bit lines BL and BLB. Inverter 416 includes a PMOS transistor 420 and an NMOS transistor 422 coupled together in series. PMOS transistor 420 has its source coupled to node 424, its drain coupled to node 426, and its gate coupled to node 428. Transistor 422 has its source coupled to node 430, its drain coupled to node 426, and its gate coupled to node 428. Node 428 serves as the input of inverter 416 and is coupled to complementary bit line BLB, and node 426 serves as the output of inverter 416 and is coupled to complementary bit line BL.

Inverter 418 includes a PMOS transistor 432 and an NMOS transistor 434. Transistor 432 has its source coupled to node 424, its drain coupled to node 428, and its gate coupled to node 426. Transistor 434 has its source coupled to node 430, its drain coupled to node 428, and its gate coupled to node 426. Node 428 serves as the output of inverter 418 and is coupled to complementary bit line BLB, and node 426 serves as the input of inverter 418 and is coupled to complementary bit line BL.

Node 424 is coupled may be coupled directly to a high voltage power supply or to a drain of a PMOS transistor 436. Transistor 436 has its source coupled to the high voltage power supply and its gate is configured to receive sense enable control signal SEB. High voltage power supply may have a voltage set at VDD, or it may be set at a boosted voltage having a voltage level higher than a voltage level of VDD.

Node 430 may be directly coupled to a low voltage power supply, or node 430 may be coupled to a drain of NMOS transistor 438. Transistor 438 has its source coupled to the low voltage power supply and its gate is configured to receive sense enable control signal SE. Low voltage power supply may be set at ground, VSS, or at a voltage having a negative or lower voltage level than the voltage level of ground or VSS. Although transistors 408, 410, 412, and 414 are illustrated as NMOS transistors, one skilled in the art will understand that bit cells 402 and 404 may be implemented using PMOS transistors by inverting the voltage of the WL as well as other voltages.

Figure 6A:
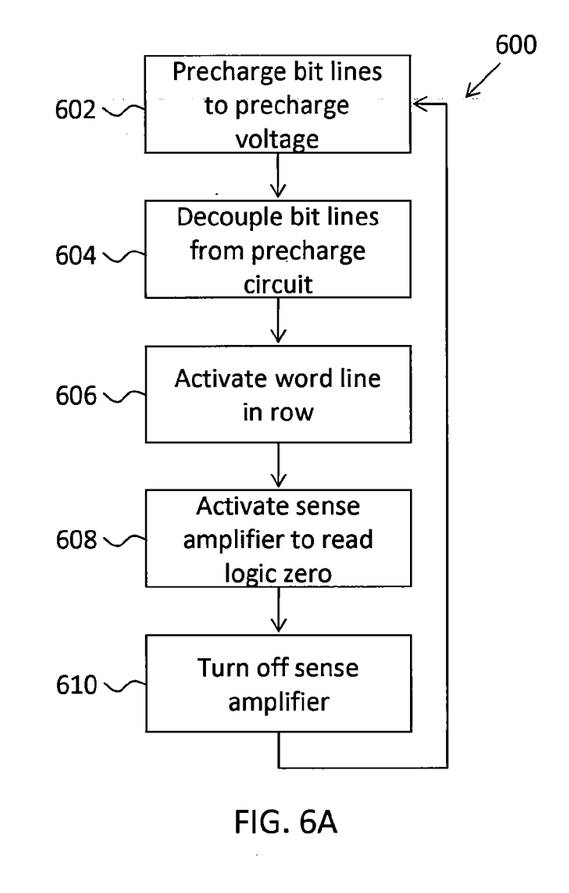
FIG. 6A is a flow diagram of one example of a method of reading a logic zero from a programmed zero bit cell in accordance with the differential ROM array illustrated in FIG. 4.

The reading of a logic zero from a programmed zero bit cell 402 is described with reference to FIG. 6A, which is a flow diagram of one example of a method 600 reading a logic zero from a differential ROM bit cell in accordance with the ROM array 400 illustrated in FIG. 4. At block 602, complementary bit lines BL and BLB are charged to precharge voltage $V_{PC}$ by a precharge circuit (not shown) coupled to complementary bit lines BL and BLB. In some embodiments, the voltage level of $V_{PC}$ may be approximately equal to supply voltage VDD of the differential ROM array 400. Precharge voltage $V_{PC}$ may have other voltage levels relative to VDD and VSS as will be understood by one skilled in the art.

Complementary bit lines BL and BLB are decoupled from the precharge voltage, $V_{PC}$, at block 604, and a WL associated with a row of bit cells 402, 404 from which data are to be read is activated at block 606. At block 608, a sense amplifier 606 in the column in which the cell from which data is to be read is activated. Blocks 604, 606, and 608 may be performed in a non-sequential order (i.e., block 608 may be performed prior to block 606 or block 604) or may be performed simultaneously with one another.

Transistor 408 turns on when WL is high as $V_{GS}$ of transistor 408 is greater than the threshold voltage, $V_{T408}$. With transistor 408 on, BL is pulled towards ground or to a low voltage level as current flows through transistor 408. Line BLB is maintained at a logic one when WL is a logic one due to the charge on BLB not having a path to ground as the source and drain of transistor 410 are not connected to BLB.

Sense amplifier 406 assists in increasing the voltage on BLB and decreasing the voltage on BL during the reading of a logic zero from a programmed zero bit cell 402. For example, sense amplifier 406 may be activated by sense enable signal SE providing a high voltage to the gate of transistor 438 and sense enable signal SEB providing a low voltage to the gate of transistor 436. A high voltage at the gate of transistor 438 turns transistor 438 on, which results in node 430 being pulled down, and a low voltage at the gate of transistor 436 turns transistor 436 off, which results in node 424 being pulled up.

The BL being pulled low by transistor 408 results in a low voltage being received at node 426, which is the input of transistor 418. The low voltage at node 426 turns transistor 434 turning off and transistor 432 turning on due to their respective sources being coupled to the low voltage supply and the high voltage supply. The voltage of the high voltage supply develops at node 428, which is coupled to complementary bit line BLB, when transistor 432 is on and transistor 434 is off to assist in complementary bit line BLB being pulled high. Node 428 being pulled high turns on transistor 422 and turns off transistor 420 due to their gates being coupled to a high voltage and their respective sources being coupled to the low voltage supply and the high voltage supply. Transistor 422 turning on couples low voltage supply to node 426, which is coupled to BL, to assist complementary bit line BL in being pulled low.

At block 610, the sense amplifier 406 is turned off or is decoupled from complementary bit lines BL and BLB. Sense amplifier 406 may be turned off or decoupled from complementary bit lines BL and BLB by transitioning sense enable control signal SE to a logic low and sense enable control signal SEB to a logic high. The low voltage received at the gate of transistor 438 turns transistor 438 off such that node 430 is effectively floating, and the high voltage received at the gate of transistor 436 turns transistor 436 off such that node 124 is effectively floating.

The complementary bit lines BL and BLB may be connected to the precharge voltage, $V_{PC}$, as method 600 returns to block 602.

Figure 6B:
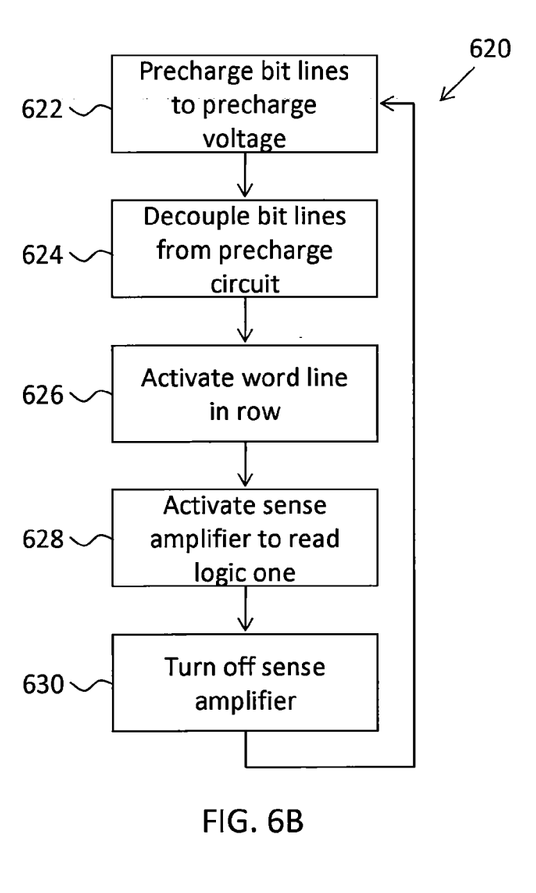
FIG. 6B is a flow diagram of one example of a method of reading a logic one from a programmed one bit cell in accordance with the differential ROM array illustrated in FIG. 4.

The reading of a logic one from a programmed one bit cell 404 is described with reference to FIG. 6B, which is a flow diagram of one example of a method 620 reading a logic one from a differential ROM bit cell in accordance with the differential ROM array 600 illustrated in FIG. 4. At block 622, complementary bit lines BL and BLB are charged to precharge voltage $V_{PC}$. As described above, the voltage level of $V_{PC}$ may be approximately equal to $\frac{1}{2}V_{DD}$, although precharge voltage $V_{PC}$ may have other voltage levels relative to VDD.

At block 624, complementary bit lines BL and BLB are decoupled from the precharge voltage such that BL and BLB may be floating. A WL is activated at block 626 to select a row of bit cells 402, 404, and sense amplifier 406 in the column in which the cell from which data is to be read is activated at block 628. One skilled in the art will understand that blocks 624, 626, and 628 may be performed in a non-sequential order (i.e., block 628 may be performed prior to block 626, which may be performed prior to block 624) or may be performed simultaneously with one another.

The WL provides a high voltage to the gate of transistor 414 to turn transistor 414 into an on state when the $V_{GS}$ of transistor 414 is greater than the threshold voltage, $V_{T414}$. BLB is pulled towards ground or to a low voltage level when transistor 414 is on as current flows through transistor 414. Line BL is maintained at a logic one when WL is a logic one due to the charge on BL not having a path to ground as the source and drain of transistor 410 are not connected to BL.

Sense amplifier 406 assists in increasing the voltage on BL while decreasing the voltage on BLB during the read operation of a logic one from a programmed one bit cell 404. For example, sense amplifier 406 may be activated by receiving a logic one at the gate of transistor 438, i.e., SE is a high voltage, and receiving a logic zero at the gate of transistor 436, i.e., SEB is a low voltage. A high voltage at the gate of transistor 438 turns transistor 438 on, which results in node 430 being pulled down, and a low voltage at the gate of transistor 436 turns transistor 436 off, which results in node 424 being pulled up.

As the BLB is pulled down by transistor 414 being on, the low voltage is received at the input of transistor 420, i.e., node 428, which results in transistor 422 turning off and transistor 420 turning on due to their respective sources being coupled to the low voltage supply and the high voltage supply. The voltage of the high voltage supply develops at node 426, which is coupled to complementary bit line BL, when transistor 420 is on and transistor 422 is off to assist in complementary bit line BL being pulled high. Node 426 being pulled high turns on transistor 434 and turns off transistor 432 due to their gates being coupled to a high voltage and their respective sources being coupled to the low voltage supply and the high voltage supply. Transistor 434 turning on couples low voltage supply to node 428, which is coupled to BLB, to assist complementary bit line BLB in being pulled low.

At block 630, the sense amplifier 406 is turned off or is decoupled from complementary bit lines BL and BLB. Sense amplifier 406 may be turned off or decoupled from complementary bit lines BL and BLB by transitioning sense enable control signal SE to a logic low and sense enable control signal SEB to a logic high. The low voltage received at the gate of transistor 438 turns transistor 438 off such that node 430 is effectively floating, and the high voltage received at the gate of transistor 436 turns transistor 436 off such that node 424 is effectively floating.

The complementary bit lines BL and BLB may be coupled to the precharge voltage, $V_{PC}$, as method 620 returns to block 622.

Figure 7:
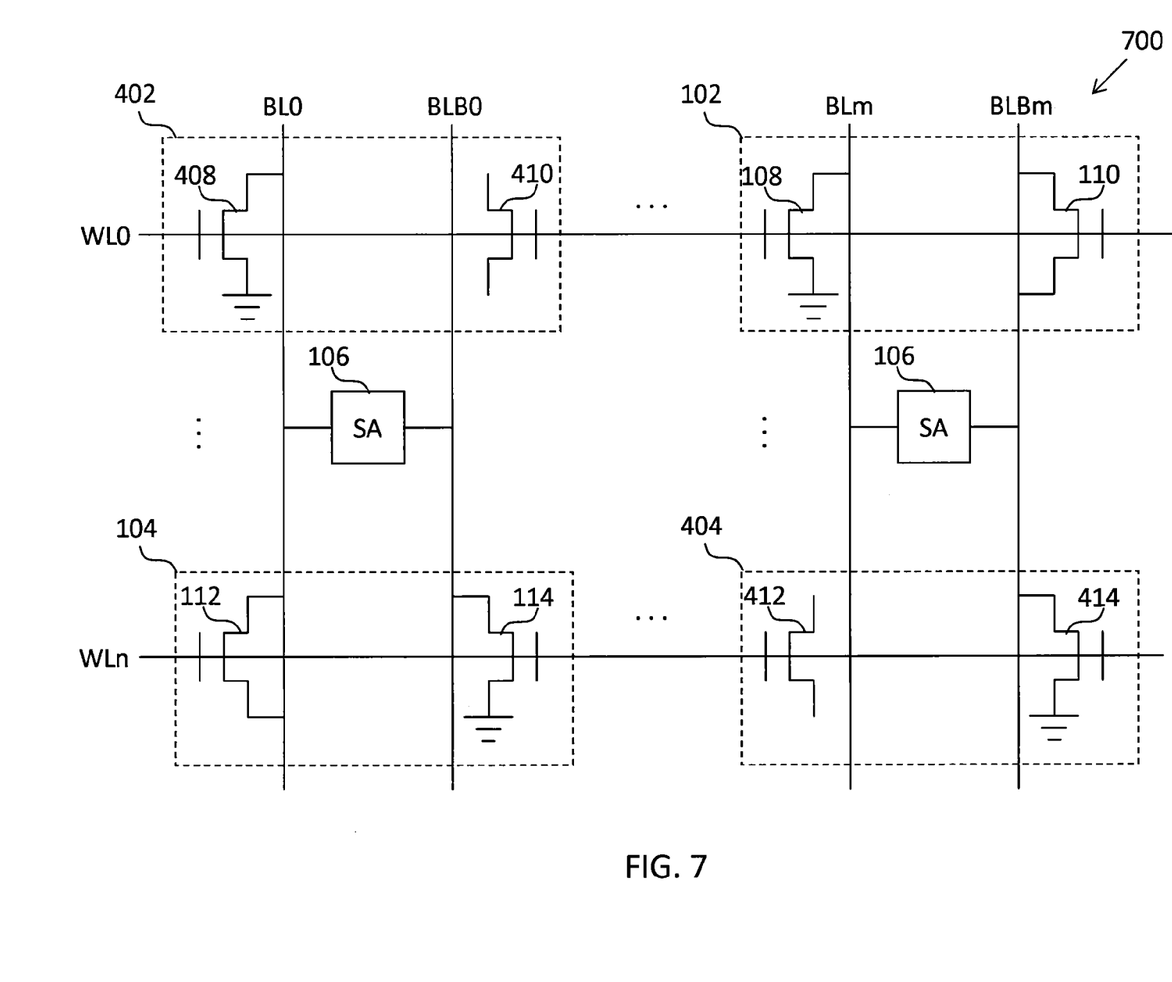
FIG. 7 illustrates another example of a differential ROM array including a plurality of programmed zero and programmed one bit cells.

FIG. 7 illustrates an embodiment of a differential ROM array 700 that includes a plurality of programmed one bit cells 102, 402 and programmed zero bit cells 104, 404. As shown in FIG. 7, each bit cell 102, 402, 104, and 404 is disposed in a row is coupled to a word line ("WL"), and each bit cell 102, 402, 104, and 404 is disposed in a column coupled to differential pair of bit lines, BL and BLB. At least one differential sense amplifier ("SA") 106 is coupled between each differential bit line pair, BL and BLB, for increasing the speed of reading of a bit of data stored in a bit cell 102, 402, 104, and 404.

Programmed zero bit cells 102, i.e., bit cells that output a logic zero when read, include a first transistor 108 having its source coupled to ground, its drain coupled to one of the differential bit lines, i.e., BL, and its gate coupled to WL. A second transistor 110 has its gate coupled to WL and its drain and source coupled to the other complementary bit line, i.e., BLB.

Programmed zero bit cells 402 each include a pair of transistors 408 and 410 each having a gate coupled to a common WL. Transistor 408 has its source coupled to ground and its drain coupled to BL. The drain and source of transistor 410 are floating, i.e., the drain and source of transistor 410 are not connected to BLB.

Programmed one bit cells 104, i.e., bit cells that output a logic one when read, also include a pair of transistors 112, 114. Transistor 112 has its gate coupled the WL and its source and drain coupled to one of the complementary bit lines, i.e., BL. Transistor 114 has its gate coupled to the WL, its source coupled to ground or a low voltage supply line, and a drain coupled to the other complementary bit line, BLB.

Programmed one bit cells 404 each include a first transistor 412 having a gate coupled to complementary bit line BL and a second transistor 414 having a gate coupled to complementary bit line BLB. Transistor 412 has its source coupled to ground or to a low voltage supply line and its drain coupled to BLB.

Although transistors 108, 408, 110, 410, 112, 412, 114, and 414 are illustrated as NMOS transistors, one skilled in the art will understand that bit cells 102, 402, 104, and 404 may be implemented using PMOS transistors by inverting the voltage of the WL as well as other voltages. The reading of logic zeroes and logic ones from bit cells 102, 402, 104, and 404 are described above and are not repeated.

In some embodiments, a differential read only memory array includes a differential sense amplifier coupled to first and second bit lines. A first bit cell is coupled to a first word line and to the first and second bit lines. The at least one bit cell includes a first transistor having a gate coupled to the first word line, a drain coupled to the first bit line, and a source coupled to a first power supply line. A second transistor has a gate coupled to the first word line. A source and a drain of the second transistor are either both connected to the second bit line or both unconnected to the second bit line.

In some embodiments, a semiconductor memory includes a plurality of differential sense amplifiers each coupled to a respective pair of bit lines, and a plurality of differential read only bit cells arranged in a plurality of rows and a plurality of columns. Each of the plurality of rows is associated with a respective word line, and each of the plurality of columns is associated with a respective pair of bit lines. A first bit cell is disposed in a first row. The first bit cell includes a first transistor having a gate coupled to a first word line, a source coupled to a first power supply, and a drain coupled to the first bit line. A second transistor has a gate coupled to the first word line, and a source and a drain that are either both connected to the second bit line or both unconnected to the second bit line.

The differential ROM bit cells and arrays disclosed herein advantageously consume less power compared to conventional ROM bit cells and arrays as the differential ROM bit cells and arrays have a smaller signal swing. Additionally, differential ROM arrays require less area on a semiconductor substrate compared to conventional single-ended ROM arrays as more bit cells may be implemented per bit line. Differential ROM arrays may also operate at higher speeds due to reduced bit line loading and/or reduce charge sharing effects when compared to conventional ROM arrays with single-ended bit cells.

Although the circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods.

What is claimed is:

1. A differential read only memory array, comprising:
   a differential sense amplifier coupled to first and second bit lines; and
   at least one bit cell coupled to a first word line and to the first and second bit lines, the at least one bit cell including:
   a first transistor having a gate coupled to the first word line, a drain coupled to the first bit line, and a source coupled to a first power supply line; and
   a second transistor having a gate coupled to the first word line,
   wherein a source and a drain of the second transistor are directly coupled together and to the second bit line such that the source and drain are not directly connected to a power supply line.

2. The differential read only memory array of claim 1, further comprising a second bit cell coupled to the first word line and to third and fourth bit lines, the second bit cell including:
   a third transistor having a gate coupled to the first word line, a drain coupled to the third bit line, and a source coupled to the first power supply line; and
   a fourth transistor having a gate coupled to the first word line and a drain and a source coupled to the fourth bit line.

3. The differential read only memory array of claim 1, further comprising a second bit cell coupled to a second word line and to the first and second bit lines, the second bit cell including:
   a third transistor having a gate coupled to the second word line, a drain coupled to the first bit line, and a source coupled to the first power supply line; and
   a fourth transistor having a gate coupled to the second word line and a drain and a source coupled to the second bit line.

4. The differential read only memory array of claim 1, further comprising a second bit cell coupled to a second word line and to the third and fourth bit lines, the second bit cell including:
   a third transistor having a gate coupled to the second word line and a source and a drain coupled to the first bit line; and
   a fourth transistor having a gate coupled to the second word line, a drain coupled to the second bit line, and a source coupled to the first power supply line.

5. The differential read only memory array of claim 1, wherein the second transistor has its drain and source decoupled from the first and second bit line lines.

6. The differential read only memory array of claim 5, further comprising a second bit cell coupled to the first word line and to third and fourth bit lines, the second bit cell including:
   a third transistor having a gate coupled to the first word line, a drain coupled to the third bit line, and a source coupled to the first power supply line; and
   a fourth transistor having a gate coupled to the first word line and a drain and a source that are unconnected to the fourth bit line.

7. The differential read only memory array of claim 5, further comprising a second bit cell coupled to a second word line and to the first and second bit lines, the second bit cell including:
   a third transistor having a gate coupled to the second word line, a drain coupled to the first bit line, and a source coupled to the first power supply line; and
   a fourth transistor having a gate coupled to the second word line and a drain and a source unconnected to the second bit line.

8. The differential read only memory array of claim 5, further comprising a second bit cell coupled to a second word line and to the first and second bit lines, the second bit cell including:
   a third transistor having a gate coupled to the second word line and a drain and a source unconnected to the first bit line; and
   a fourth transistor having a gate coupled to the second word line, a drain coupled to the second bit line, and a source coupled to the first power supply line.

9. A semiconductor memory, comprising:
   a plurality of differential sense amplifiers each coupled to a respective pair of bit lines; and
   a plurality of differential read only bit cells arranged in a plurality of rows and a plurality of columns, each of the plurality of rows associated with a respective word line, and each of the plurality of columns associated with a respective pair of bit lines,
   wherein a first bit cell is disposed in a first row and includes:
   a first transistor having a gate coupled to a first word line, a source coupled to a first power supply, and a drain coupled to the first bit line, wherein the first bit cell is configured to output a logic zero to the first bit line,
   a second transistor has a gate coupled to the first word line, and a source and a drain of the second transistor are both directly connected to the second bit line such that the source and drain are not directly connected to a power supply line.

10. The semiconductor memory of claim 9, wherein the first row includes a second bit cell comprising:
    a third transistor having a gate coupled to the first word line, a source coupled to the first power supply, and a drain coupled to the third bit line; and
    a fourth transistor having a gate coupled to the first word line and a source and a drain coupled to a fourth bit line.

11. The semiconductor memory of claim 9, wherein the first bit cell and a second bit cell are disposed in a first column, the second bit cell configured to output a logic zero to the first bit line during a read operation and includes:
    a third transistor having a gate coupled to a second word line, a source coupled to the first power supply, and a drain coupled to the first bit line; and
    a fourth transistor having a gate coupled to the second word line and a source and a drain coupled to the second bit line.

12. The semiconductor memory of claim 9, wherein the first bit cell and a second bit cell are disposed in a first column, the second bit cell configured to output a logic one to the first bit line during a read operation and includes:

a third transistor having a gate coupled to a second word line and a source and a drain coupled to the first bit line; and a fourth transistor having a gate coupled to the second word line, a source coupled to the first power supply, and a drain coupled to a second bit line.

13. The semiconductor memory of claim 9, wherein the first bit cell is configured to output a logic zero to a first bit line, and the source and the drain are unconnected to the second bit line.

14. The semiconductor memory of claim 13, wherein the first row includes a second bit cell disposed between third and fourth bit lines, the second bit cell comprising:

a third transistor having a gate coupled to the first word line, a source coupled to the first power supply, and a drain coupled to the third bit line; and a fourth transistor having a gate coupled to the first word line and a source and a drain unconnected to a fourth bit line.

15. The semiconductor memory of claim 13, wherein the first bit cell and a second bit cell are disposed in a first column, the second bit cell configured to output a logic one to the first bit line during a read operation and includes:

a third transistor having a gate coupled to a second word line, a source coupled to the first power supply, and a drain coupled to the second bit line; and a fourth transistor having a gate coupled to the second word line and a source and a drain unconnected to the first bit line.

16. The semiconductor memory of claim 13, wherein the first bit cell and a second bit cell are disposed a first column, the second bit cell configured to output a logic zero to the first bit line during a read operation and includes:

a third transistor having a gate coupled to a second word line, a source coupled to the first power supply, and a drain coupled to the first bit line; and a fourth transistor having a gate coupled to the second word line and a source and a drain unconnected to the second bit line.

17. The semiconductor memory of claim 9, wherein the first bit cell is configured to output a logic one to the second bit line, the source and the drain of the second transistor are coupled to the first bit line.

18. The semiconductor memory of claim 9, wherein the first bit cell is configured to output a logic one to the second bit line, and the source and the drain of the second transistor are unconnected to the first bit line.

* * * * *